Figure 1A:
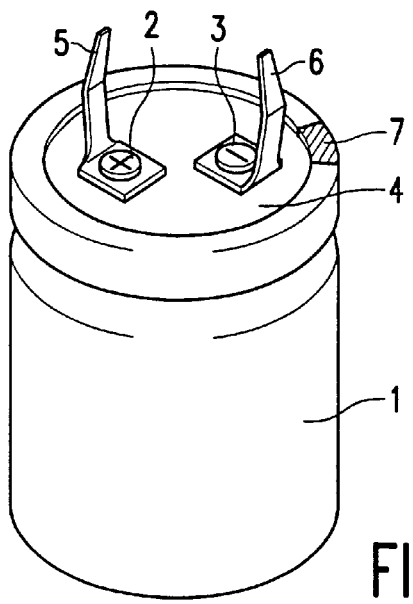

United States Patent
Dijkstra

[11] Patent Number: 5,921,820
[45] Date of Patent: Jul. 13, 1999

[54] PASSIVE COMPONENT

[75] Inventor: Ruurd Dijkstra, Zwolle, Netherlands

[73] Assignee: BC Components Holdings B.V., Eindhoven, Netherlands

[21] Appl. No.: 08/935,594

[22] Filed: Sep. 23, 1997

[30] Foreign Application Priority Data

Sep. 24, 1996 [EP] European Pat. Off. ............... 96202668

[51] Int. Cl.⁶ .................................................. H01R 13/42
[52] U.S. Cl. ........................... 439/751; 361/773; 361/520; 361/538
[58] Field of Search ...................... 439/751, 82; 361/773, 361/520, 538; 174/52.4, 52.6

[56] References Cited

U.S. PATENT DOCUMENTS

| | | | |
|---|---|---|---|
| 2,246,933 | 6/1941 | Deeley | 361/538 |
| 4,363,078 | 12/1982 | Dwyer | 361/520 |
| 4,631,631 | 12/1986 | Hodges et al. | 361/520 |
| 5,381,301 | 1/1995 | Hudis | 361/520 |
| 5,521,791 | 5/1996 | Takada | 361/538 |

FOREIGN PATENT DOCUMENTS 2408165  9/1974  Germany.

*Primary Examiner*—Gary F. Paumen
*Attorney, Agent, or Firm*—Frishauf, Holtz, Goodman, Langer & Chick

[57] ABSTRACT

In this Application, a description is given of a passive component comprising two electric connections with a plug-in portion for securing and electrically connecting the component to a printed circuit board, for example an electrolytic capacitor. In accordance with the invention, this component is so constructed that both plug-in portions are provided with two pins, with the plug-in portions being so positioned that the four pins do not extend in a flat plane. By virtue of the measure in accordance with the invention, resoldering of such components can be dispensed with. The use of pins whose length and width are different enables the manual installation of the components in accordance with the invention in the correct position to be simplified.

4 Claims, 2 Drawing Sheets

PASSIVE COMPONENT

The invention relates to a passive component which is provided with two electric connections having a plug-in portion for securing and electrically connecting the component to a printed circuit board.

Such passive components are common knowledge, for example in the form of resistors and capacitors. In the case of such components, both plug-in portions, or pins attached thereto, are inserted in holes present in the printed circuit board and tightly secured therein. Subsequently, the plug-in portions are electrically connected to electric conductor tracks of the printed circuit board by means of, for example, a wave-solder treatment. In principle, the plug-in portions may be integral with the connections. Customarily, however, separate plug-in portions are secured to the connections.

It has been found that the use of a printed circuit board, comprising the known passive component, in a high-voltage circuit may lead to problems. In such an application, heat may be generated at the location of one of the plug-in portions or of the pin of the passive component connected thereto. This generation of heat may be accompanied by sparking. This may lead to failure and, in the worst case, to burning of the high-voltage circuit. These phenomena are attributed to a poor electric contact between a plug-in portion and the electric conductor track connected thereto. To preclude this adverse effect, passive components of such a high-voltage circuit are resoldered either manually or by means of a robot. This resoldering process is a time-consuming and, also for other reasons, expensive additional process step.

It is an object of the invention to eliminate the above-mentioned drawback. The invention more particularly aims at providing a passive component which can be secured in a reliable manner, without a resoldering operation, by means of a wave-soldering treatment, so that a good electric contact is formed.

These and other objects of the invention are achieved by a passive component of the type mentioned in the opening paragraph, which is characterized in that both plug-in portions are provided with two pins, said plug-in portions being positioned so that the four pins are not situated in a flat plane.

The invention is based on the experimentally gained insight that a "shadow effect" in the wave-solder process is the main factor why the electric contact between the two plug-in portions or pins of the component and the tracks of the printed circuit board is not always satisfactory. This effect will be explained in greater detail in the description of FIG. 1 of the present Application. By using plug-in portions having two pins, which are secured in separate holes of the printed circuit board, the adverse shadow effect is precluded.

A preferred embodiment of the passive component in accordance with the invention is characterized in that the pins of each plug-in portion are different in length. In practice, it has been found that the manual positioning of the component is simplified if two of the four pins are longer than the other two pins. Preferably, the two pins of two different plug-in portions of the component which are closest to each other are equal in length.

In another interesting embodiment, the passive component is in the form of an electrolytic capacitor having curved pins which are incorporated in the plug-in portion such as to be resilient relative to each other. Said characteristics of the pins provide, in particular large, passive components such as electrolytic capacitors, with extra stability on the printed circuit board. The pins are preferably curved in such a manner that the center part of both pins of a plug-in portion are further removed from each other than the two end portions. Since both pins are resiliently incorporated in the plug-in portion, the pins can be bent, in succession, towards each other and away from each other, during the mounting of the component in the holes of the printed circuit board. Due to this embodiment of the pins, the electrolytic capacitor is tightly secured on the printed circuit board.

A further favourable embodiment of the passive component in accordance with the invention is characterized in that the pins of each plug-in portion differ in width. By providing the printed circuit board with holes which correspond to the different widths of the pins, the component can be mounted in only one way. By means of this measure, it is precluded that the electrolytic capacitor can be mounted in the wrong polarity.

These and other aspects of the invention will be apparent from and elucidated with reference to the embodiments described hereinafter.

Figure 1B:
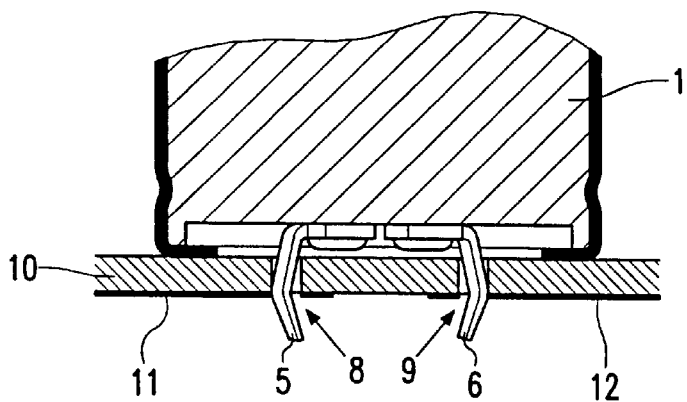
Figure 1C:
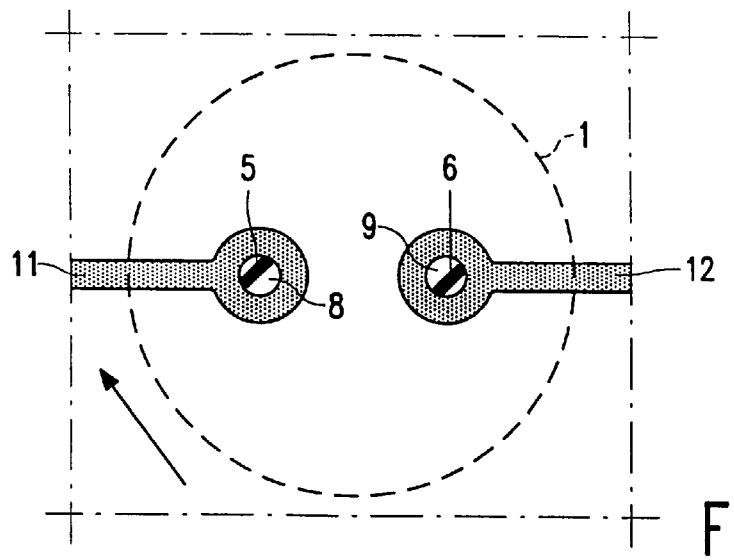
Figure 2A:
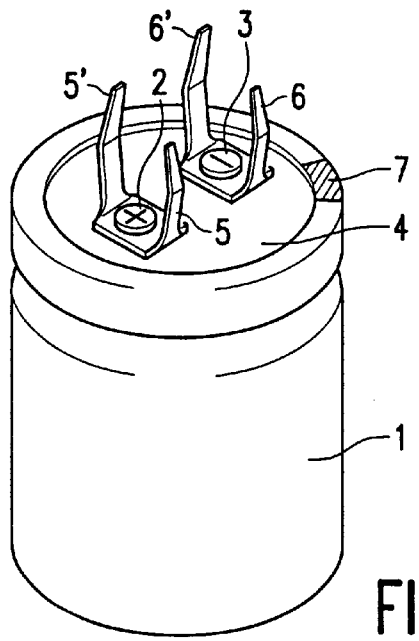
Figure 2B:
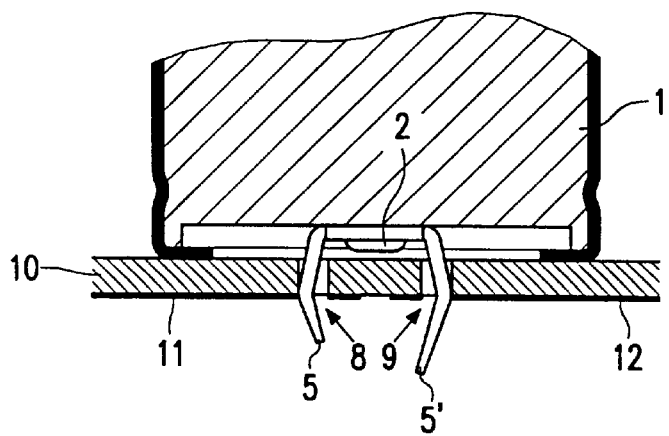
Figure 2C:
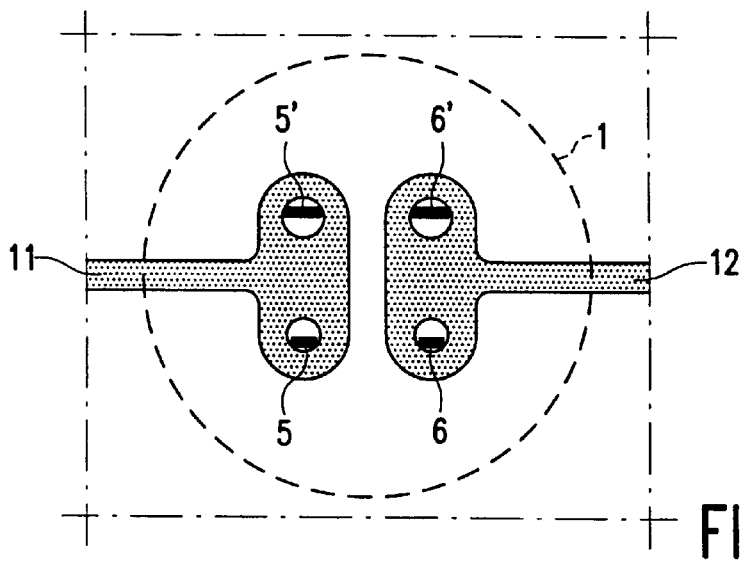

In the drawings:

FIGS. 1A, 1B, and 1C are a passive components in accordance with the prior art,

FIGS. 2A, 2B and 2C are a passive components in accordance with the invention.

For clarity, the Figures are not drawn to scale.

FIG. 1-A is an elevational view of a passive component in the form of an electrolytic capacitor in accordance with the state of the art. This capacitor comprises a cup-shaped housing (1) which accommodates a capacitor foil (not shown). Said foil is composed of a strip of aluminium (anode) provided with an oxide layer, two or more separator foils impregnated with an electrolyte liquid and a second aluminium strip (cathode) which may or may not be provided with an oxide layer. The anode foil is connected to the anode connection (2). The cathode foil is connected to the cathode connection (3). Both connections are passed through a cover (4) which seals the housing (1) in a liquid-tight and gas-tight manner.

Both connections are provided with a plug-in portion, which portions each comprise one metal pin (5, 6), which project from the housing in the axial direction. The plug-in portions are secured to the connections by means of a riveted joint or a soldered joint. An indicator (7) on the housing indicates the polarity of the connections.

FIGS. 1-B and 1-C show, schematically and in a sectional view, how the known passive component is secured to a printed circuit board and how the pins are soldered to the conductor tracks. FIG. 1-B shows the capacitor in an axial sectional view through both connections. This Figure clearly shows that both pins (5, 6) are tightly secured in the holes (8, 9) of the printed circuit board (10), which is provided with conductor tracks (11, 12). FIG. 1-C is a sectional view in the plane of the printed circuit board. Circle 1 in FIG. 1-C denotes the circumference of the passive component.

After the electrolytic capacitor has been mounted on the printed circuit board by hand or by means of a robot, a wave-soldering treatment is carried out. In this treatment, liquid solder material is passed over the surface of the printed circuit board facing away from the component. Experiments leading to the invention have revealed that the direction of flow of the solder is very important to the eventual soldered joint which is formed between the pin and the conductor track. If the solder is passed over the printed circuit board in the direction indicated by the arrow (FIG. 1-C), then a good soldered joint is formed between the pin (5) and the conductor track (11), however, owing to the shadow effect of the pin (6), a poor soldered joint is formed between the pin (6) and the conductor track (12). In the latter joint, the solder flowing into the hole (9) is insufficient. Consequently, a resolder process is necessary.

FIG. 2 is an elevational view of a passive component in the form of an electrolytic capacitor in accordance with the invention. In FIG. 1 and FIG. 2, like parts bear like reference numerals. In accordance with the invention, each of the plug-in portions comprises two pins (5, 5') and (6, 6'). These pins are so positioned that they do not lie in a flat plane. If the pins are situated in a flat plane, a shadow effect may still occur if, in the wave-soldering process, the solder moves in a direction parallel to the plane in which the pins are situated. Preferably, the pins are so positioned that the line interconnecting the ends of the pins extends at right angles to the line interconnecting the center of both connections. In this case, the ends of the four connections form the vertices of an imaginary rectangle.

In the embodiment of the invention shown, at least one of the two pins of a plug-in portion will form a good soldered joint with the relevant conductor track. Any shadow effect during the wave-soldering process will, at the most, affect one of the two pins of both connections. By virtue thereof, the undesirable resoldering process can be dispensed with.

As shown, each of the connections is provided with a part in which two pins are accommodated, and the pins of each part are different in length. By virtue thereof, the manual positioning of the electrolytic capacitor on a printed circuit board is simplified. As the connections are preferably provided with identical parts, the lengths of the four pins of the component are equal two by two.

It has also been shown that there is a difference in width between the two pins of each part. This enables positional errors relating to the polarity of the component to be precluded. In this case, the thickness of the pins is the same.

FIG. 2-B is a schematic, axial sectional view, through connection (2), of the component shown in FIG. 2-A with pins (5) and (5'). FIG. 2-B shows that the pins (5) and (5') differ in length and in width. The Figure also shows that the centers of the pins of this plug-in portion are further removed from each other than the ends of the pins. The plug-in portions of the component have the same dimensions.

FIG. 2-C is a schematic, sectional view in the plane of the printed circuit board. This printed circuit board comprises two pairs of holes, one pair of holes having a relatively large section and the other pair having a relatively small section. Each pair of holes is connected to a conductor track. For example, conductor track (11) contacts the pair of holes (5, 5') and conductor track (12) contacts the pair of holes (6, 6'). As the pins (5', 6') with the largest width only fit in the holes with the largest diameter, the component can be mounted on the printed circuit board in only one way. This enables polarity errors during the positioning of the component to be precluded.

It is noted that the description of the invention relates to an electrolytic capacitor. However, the invention can also very advantageously be used in other types of capacitors and resistors. The greatest advantage, however, is achieved when the invention is used in capacitors of the type described herein.

I claim:

1. A passive component which is provided with two electric connections each having a plug-in portion for securing and electrically connecting the component to a printed circuit board, characterized in that both plug-in portions are provided with two pins, said plug-in portions being positioned so that the four pins are not situated in a flat plane.

2. A passive component as claimed in claim 1, characterized in that the pins of each plug-in portion are different in length.

3. A passive component as claimed in claim 1, in the form of an electrolytic capacitor, characterized in that the pins are curved and incorporated in the plug-in portion such as to be resilient relative to each other.

4. A passive component as claimed in claim 1, characterized in that the pins of each plug-in portion differ in width.

* * * * *